United States Patent [19]

Bernstein et al.

[11] Patent Number: 6,163,152
[45] Date of Patent: Dec. 19, 2000

[54] METHOD AND SYSTEM FOR CORRECTING ERRORS IN MR IMAGES DUE TO REGIONS OF GRADIENT NON-UNIFORMITY FOR PARAMETRIC IMAGING SUCH AS QUANTITATIVE FLOW ANALYSIS

[75] Inventors: Matthew A. Bernstein, Waukesha; Jason A. Polzin, Lake Mills, both of Wis.

[73] Assignee: General Electric Company, Milwaukee, Wis.

[21] Appl. No.: 09/097,525

[22] Filed: Jun. 15, 1998

[51] Int. Cl.$^7$ ........................................... G01V 3/00
[52] U.S. Cl. ........................................... 324/306; 324/307
[58] Field of Search ................... 324/306, 307, 324/309

[56] References Cited

U.S. PATENT DOCUMENTS

| | | | |
|---|---|---|---|
| Re. 32,701 | 6/1988 | Moran | 324/309 |
| 4,591,789 | 5/1986 | Glover et al. | 324/307 |
| 4,609,872 | 9/1986 | O'Donnell | 324/306 |
| 4,809,701 | 3/1989 | Le Bihan et al. | 128/653 |
| 5,092,335 | 3/1992 | Le Bihan | 128/653 |
| 5,093,620 | 3/1992 | Pelc et al. | 324/306 |
| 5,226,418 | 7/1993 | Berstein et al. | 324/306 |
| 5,539,310 | 7/1996 | Basser et al. | 324/307 |
| 5,642,047 | 6/1997 | Bernstein | 324/309 |
| 5,684,400 | 11/1997 | Tsukamoto et al. | 324/309 |

*Primary Examiner*—Christine K. Oda
*Assistant Examiner*—Tiffany A. Fetzner
*Attorney, Agent, or Firm*—Boyle Fredrickson Ziolkowski; Christian G. Cabou; Phyllis Y. Price

[57] ABSTRACT

A system and method for correcting systematic errors that occur in MR images due to magnetic gradient non-uniformity is disclosed for use with parametric analysis. A GradWarp geometric correction operation is applied in reconstructing quantitative parametric analysis images in regions of gradient non-uniformity. The method includes generating an error map of magnetic gradient strength as a function of distance for an MR image scan and acquiring MR data that contain such systematic errors. The method next includes either calculating a measured diffusion image, a phase difference image, or similar image, based on the acquired MR data, and then calculating a corrected parametric image using the error map and the measured diffusion image, the phase difference image, or other similar parametric image. The method is incorporated into a system having a computer programmed to perform the aforementioned steps and functions.

27 Claims, 3 Drawing Sheets

METHOD AND SYSTEM FOR CORRECTING ERRORS IN MR IMAGES DUE TO REGIONS OF GRADIENT NON-UNIFORMITY FOR PARAMETRIC IMAGING SUCH AS QUANTITATIVE FLOW ANALYSIS

BACKGROUND OF THE INVENTION

The present invention relates generally to magnetic resonance imaging (MRI), and more particularly to a system and method to correct magnetic gradient non-uniformities that occur in phase contrast MR images used in reconstructing quantitative flow analysis images. The present, invention can also be applied to correct maps of diffusion coefficients measured with diffusion weighted imaging.

Quantitative phase contrast imaging is a growing application. In one embodiment, a phase contrast scan is acquired such that the imaging plane is approximately perpendicular to the vessel of interest. The phase contrast image contains quantitative velocity (cm/s) information. Flow (ml/min) information can be obtained by summing the product of the perpendicular velocity component and the area of each pixel over the cross section of the vessel. Hereinafter, this procedure will be referenced to as "flow analysis".

A systematic error in the flow analysis procedure is the actual gradient strength of the applied imaging and velocity encoding gradients and can differ from the nominal strength at some locations within the bore of the magnet. In standard, non-phase contrast imaging this gradient non-uniformity is corrected with a procedure called "GradWarp", which is described in detail in commonly assigned U.S. Pat. No. 4,591,789 issued May 27, 1986 to Glover et al, and is applied as described in commonly assigned U.S. Pat. No. 5,642,047, issued Jun. 24, 1997 to Bernstein, both of which are incorporated herein by reference. When the gradients of a magnetic field vary, or are non-uniform, the resulting images can be distorted, or warped. This problem is typically exasperated with increasing distance from the isocenter of the magnet. These images can be corrected using such a GradWarp geometric correction operation. Such gradient non-uniformities have previously been ignored for the flow encoding gradients. However, these non-uniformities do in fact create inaccuracies in the velocities that are measured in flow analysis. Flow analysis can be done upon any moving matter in the body, and commonly includes obtaining the flow velocities and/or volume flow rates of blood, cerebral spinal fluid, or the velocity of the myocardium. The non-uniformities can cause the measured velocity to differ from the actual velocity in regions far from the magnet isocenter.

It would therefore be desirable to have a system and method to correct for such systematic errors occurring as a result of magnetic gradient non-uniformity in phase contrast MR images for quantitative flow analysis that solves the aforementioned problems.

SUMMARY OF THE INVENTION

The present invention is directed toward extending Grad-Warp to quantitative phase contrast exams and is a method and system in which gradient non-uniformity correction is applied to parametric analysis images. The method creates an error map to correct in-plane, non-uniformities in the magnetic gradients to obtain the correct vessel area during an MR scan. In flow analysis, for example, a measured velocity is obtained, and under the present invention, is corrected using the error map regardless of the encoding direction. This application is particularly useful for large FoV flow analysis (FoV>32 cm), off-center FoV flow analysis, and flow analysis with surface gradient coils.

A system and method for correcting systematic errors that occur in phase contrast MR images due to magnetic gradient non-uniformity is disclosed for use with quantitative flow analysis. A GradWarp geometric correction operation is applied in reconstructing quantitative flow analysis images in regions of gradient non-uniformity. The method includes generating an error map of magnetic velocity gradient strength as a function of distance from iso-center for an MR image scan, and acquiring at least two MR data sets containing the systematic errors and generating a phase image therefrom, for each acquired MR data set. A phase difference image is calculated to determine a measured velocity and a corrected velocity, which is calculated using the measured velocity and the error map. The method is incorporated into a system having a computer programmed to perform the aforementioned steps and functions.

In accordance with another aspect of the invention, a system and method for correcting systematic errors is disclosed for use with other parametric imaging methods, such as in diffusion MR imaging. This system and method includes generating at least one gradient non-uniformity error map, as similarly set forth above, and then acquiring at least one MR data set with diffusion sensitizing gradients containing the systematic errors that are due to the magnetic gradient non-uniformity. Thereafter, a measured diffusion image is calculated based on the acquired MR data sets and a corrected diffusion image is calculated using the measured diffusion image and the gradient non-uniformity error map.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
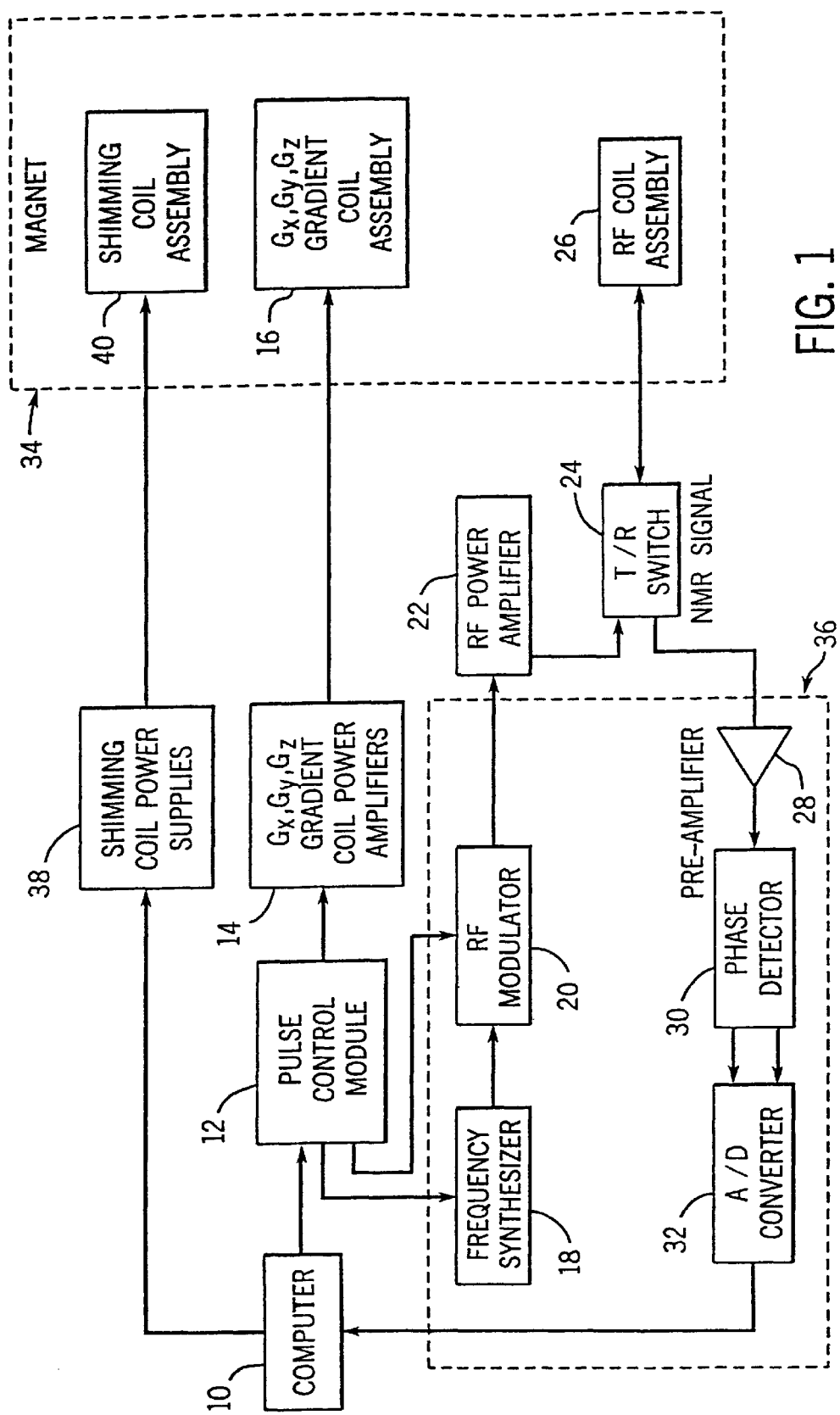
FIG. 1 is a is a schematic block diagram of an NMR imaging system suitable for use with the present invention.

Referring to FIG. 1, a nuclear magnetic resonance (NMR) imaging system of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16 (Gx, Gy, Gz, gradient coil assembly) which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce NMR images of the object. Computer 10 also controls shimming coil power supplies 38 to power shimming coil assembly 40.

The present invention includes a method and system suitable for use with the above-referenced NMR system, or any similar system for obtaining MR phase contrast images for use in quantitative flow analysis. The system and method generally include first generating an error map of the magnetic gradient strength of the magnet of the NMR system as a function of distance from the magnet for an MR image scan. The error map is generated spatially based on pixel displacement on the x, y, and z axes. An error map is generated for each MR scan plane and for each velocity direction.

Figure 2:
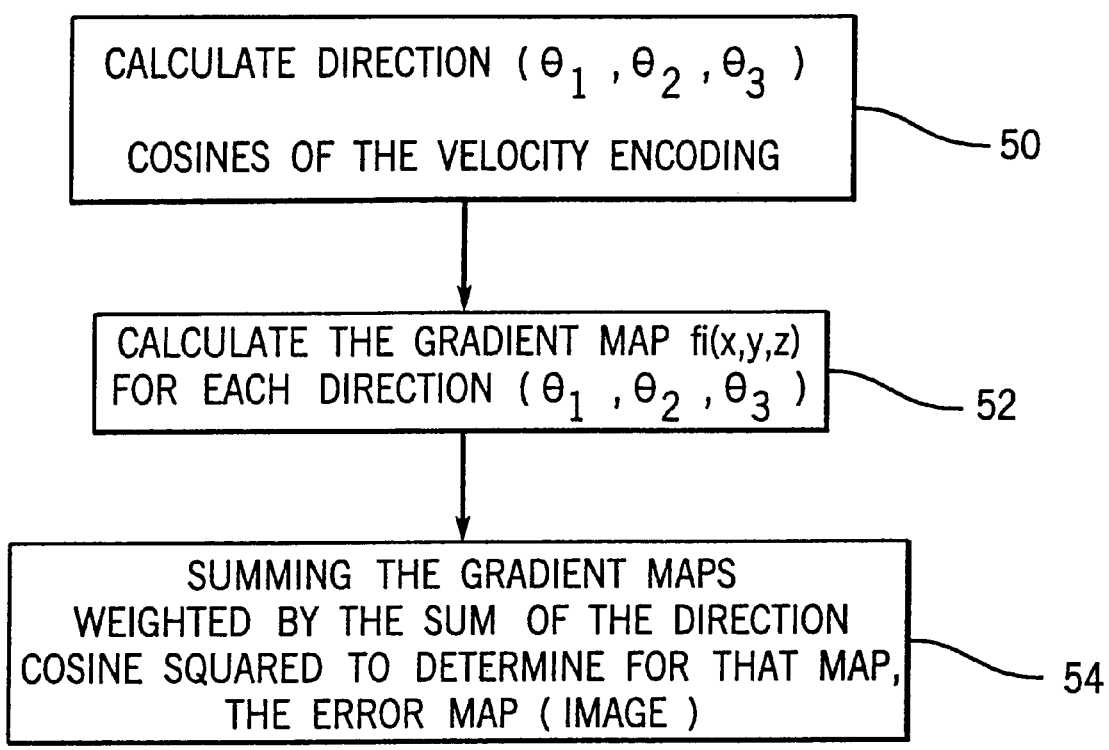
FIG. 2 is a flow chart of the processing steps associated with creating an error map according to one aspect of the present invention.

The method and system for generating the error map is disclosed in flow chart form in FIG. 2. To create the error map, first the direction cosines (cos $\theta_1$, cos $\theta_2$, cos $\theta_3$) of each of the velocity encoding vectors must be calculated 50. It is assumed that the image data acquisitions are sensitive to velocities in one particular direction and are encoded accordingly. However, it should be understood that the present invention is readily adaptable to encoding of the velocity vectors in any predetermined direction. The next step in determining the error map is to calculate the gradient map 52 for each direction $\theta 1$, $\theta 2$, and $\theta 3$. It is noted that these calculations will be described in further detail under the Detailed Theory section. The gradient map is thus created for each direction, and each is a function of each axis x, y, and z, respectively. Finally, the last step in creating the error map is the summation of the gradient maps as weighted by the sum of the direction cosines squared 54. The summation of the gradient maps is shown in equation form as the denominator in the aforementioned Equation 19.

Figure 3:
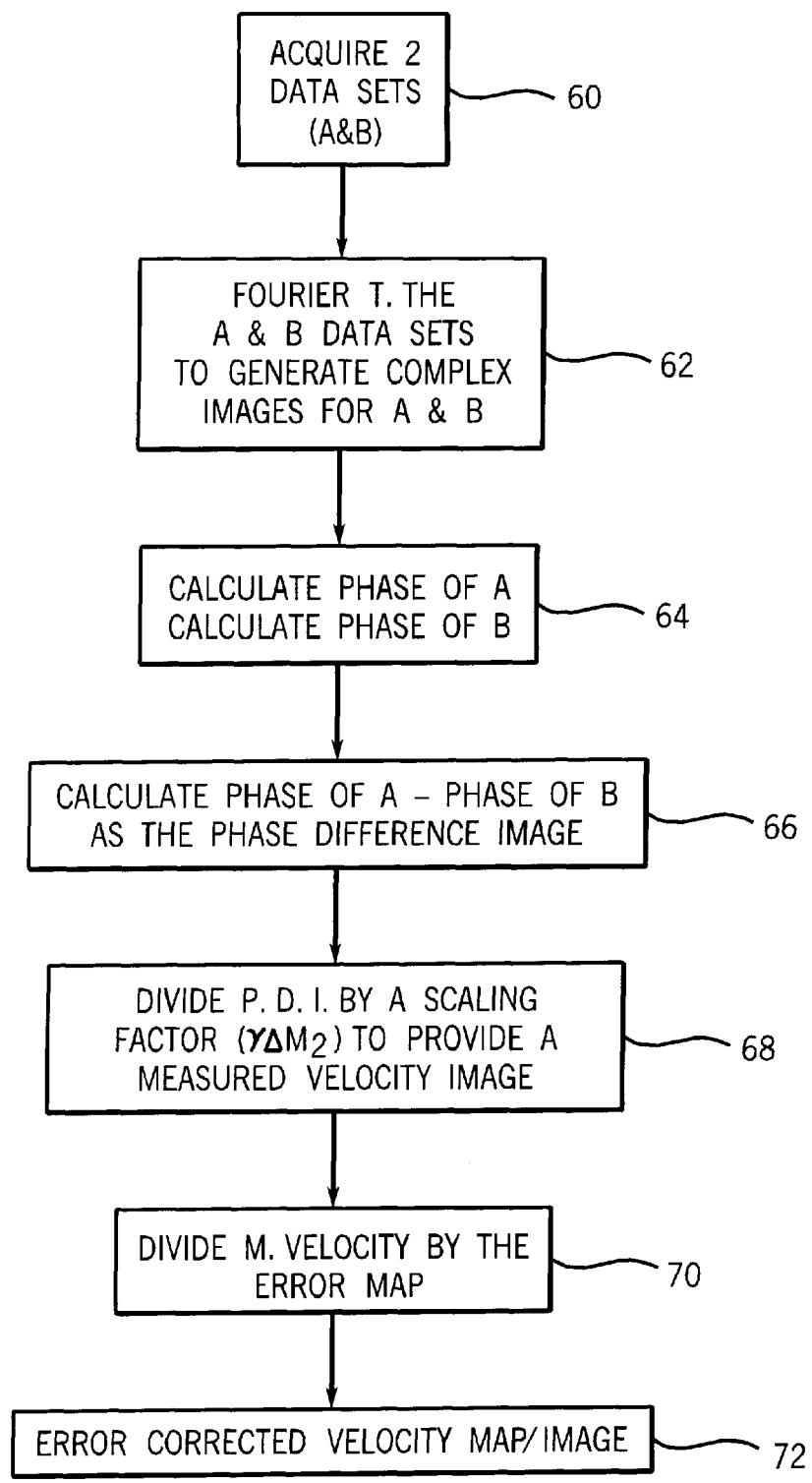
FIG. 3 is a flow chart of the processing steps of a system using the error map of FIG. 2 in accordance with the present invention.

The error map as created in FIG. 2, is then used within the overall error correction scheme as set forth in FIG. 3. First, at least two phase contrast MR data sets A and B are acquired at 60. This raw data contains the systematic errors that result from the magnetic gradient non-uniformity within the MRI. Such gradient non-uniformity often manifests as decreasing gradient strength as the distance from the magnet center increases. Next, the data sets are Fourier transformed to generate complex images for each data set 62. Once a complex image is generated for each data set A and B, then the system and method of the present invention calculates the phase of A and the phase of B 64. Then, the phase of one data set is subtracted from the phase of the second data set to create a phase difference image at 66. Thereafter, the phase difference image is divided by a scaling factor $\gamma \Delta M_1$ to create a measured velocity image $v_{measured}$ at 68 where $\gamma$ is the gyromagnetic ratio, and $\Delta M_1$ is the change in gradient first moment between the acquisition of set A and set B. A corrected velocity image $v_{corrected}$ is then calculated by dividing the measured velocity $v_{measured}$ by the error map at 70, 72, and as shown in the aforementioned Equation 19.

As one skilled in the art will readily recognize, other mathematically equivalent steps can alternatively be used to form the phase difference image, as is well known, and described in RECONSTRUCTIONS OF PHASE CONTRAST, PHASED ARRAY MULTICOIL DATA by Bernstein, et. al, MAGNETIC RESONANCE IN MEDICINE (1994).

Detailed Theory

The method and system, as generally described with reference to FIGS. 2 and 3, and implemented in a system similar to that shown in FIG. 1, will now be described in further detail. A GradWarp geometric correction operation is applied on an image I, and is denoted by GW(I). For further background on GradWarp operations, the reader is directed to the aforementioned, commonly assigned U.S. Pat. Nos. 5,642,047 and 4,591,789. The GradWarp operation uses the following three pre-tabulated functions:

$$f_1(x, y, z) = \frac{G_{x,corrected}(x, y, z)}{G_{x,nominal}(x, y, z)}, \quad (1)$$

$$f_2(x, y, z) = \frac{G_{y,corrected}(x, y, z)}{G_{y,nominal}(x, y, z)}, \quad (2)$$

$$f_3(x, y, z) = \frac{G_{z,corrected}(x, y, z)}{G_{z,nominal}(x, y, z)}, \quad (3)$$

where x, y, and z are the physical, magnet coordinates. Normally the functions $f$ are expressed as polynomial functions of x, y, z in accordance with a spherical harmonic expansion.

The first step is to correct for the geometrical distortion in the imaging plane caused by gradient non-uniformity. This is accomplished with the method set forth in the aforementioned U.S. Pat. No. 5,642,047. The basic idea of this method is to apply a GradWarp operation to the real and imaginary parts of the phase difference image separately, prior to the arctangent operation:

$$(\Delta\phi)_{GW} = \text{atan2}\{GW[\text{Im}(AB^*)], GW[\text{Re}(AB^*)]\}, \quad (4)$$

where A is a complex image reconstructed from the "positive" flow encoding, and B is separate complex image reconstructed from the "negative" flow encoding. A further refinement of this step, disclosed in the aforementioned U.S. Pat. No. 5,642,047, is to normalize both the real and imaginary parts by a power of the magnitude image prior to the GW operation, for example:

$$\Delta\phi_{GW} = \text{atan2}\left\{GW\left[\frac{\text{Im}(AB^*)}{\sqrt{|AB^*|}}\right], GW\left[\frac{\text{Re}(AB^*)}{\sqrt{|AB^*|}}\right]\right\}. \quad (5)$$

The refinement described in Eqn. 5 can reduce ringing artifacts at air-tissue boundaries, while not affecting the quantitative accuracy of the GradWarp'ed phase difference $\Delta\phi_{GW}$. The first step corrects the in-plane geometrical distortion of the phase contrast image. This insures that the area of the vessel is accurately depicted.

The next step deals with the accuracy of the measured flow velocity. This step corrects the flow encoding, which is normally perpendicular to the imaging plane, for gradient non-uniformity. The average velocity is encoded in the pixel phase according to the relation:

$$\Delta\phi = \gamma v \Delta M_1 = \gamma \int (G_{s+}(t) - G_{s-}(t))t\, dt = \gamma \int \Delta G_s(t) t\, dt. \quad (6)$$

The subscripts s+ and s− denote the two bipolar encodings, $\gamma$ is the gyromagnetic ratio, and v is the true velocity that we want to measure. If the imaging plane is orthogonal, then the velocity encoding gradient $G_s$, which is perpendicular to the image plane, will also lie in an orthogonal direction. The orthogonal case, in which the functional and physical axes coincide, is fairly straightforward since the velocity encoding gradient is reduced by a single $f$-factor. Since the actual encoding gradient can differ from the nominal encoding gradients according to Eqns. (1–3), we conclude that:

$$v_{corrected} = \frac{v_{measured}}{f_s(x, y, z)}. \quad (7)$$

Where $f_s$ is the gradient non-uniformity factor for any arbitrary direction. Thus the velocity measured in an orthogonal direction can be corrected simply by dividing by the appropriate GradWarp factor.

In general however, the imaging plane can be oblique, and the flow encoding gradient is oriented in an arbitrary direction. To account for this important case, $\vec{G}_s$ is defined as:

$$\vec{G}_s = (\hat{i}(\vec{G}_s \cdot \hat{i}) + \hat{j}(\vec{G}_s \cdot \hat{j}) + \hat{k}(\vec{G}_s \cdot \hat{k})) \quad (8)$$

$$\vec{G}_s = (\cos\theta_1, \cos\theta_2, \cos\theta_3).$$

where "^" denotes unit vector, "·" denotes the dot or inner product, $\hat{i}$, $\hat{j}$, and $\hat{k}$ are unit vectors in the x,y,z directions, respectively, and the direction cosines $\cos\theta_1$, $\cos\theta_2$, $\cos\theta_3$ can be easily determined from the orthogonal rotation matrix, which defines the functional-to-physical transformations. In fact, if $\vec{G}_s$ lies along a single logical direction, as is common, then each direction cosine is equal to a single matrix element in the orthogonal functional-to-physical rotation matrix.

From Eqn. (8), the normalization of the direction cosines is obtained:

$$\cos^2\theta_1 + \cos^2\theta_2 + \cos^2\theta_3 = 1. \quad (9)$$

For the oblique case, Eqn. (6) can be written in vector notation as:

$$\Delta\phi = \gamma \vec{v} \cdot \int \Delta \vec{G}_s(t) t\, dt. \quad (10)$$

Since only the component of $\vec{v}$ which is parallel to $\vec{G}_s$ contributes to the dot product, without loss of generality, a subscript "s" to $\vec{v}$ can be added such that:

$$\Delta\phi = \gamma \vec{v}_s \cdot \int \Delta \vec{G}_s(t) t\, dt. \quad (11)$$

The dot product in Eqn. (11) can then be evaluated directly in the x,y,z coordinate system:

$$\Delta\phi = \gamma \sum_{i=1}^{3} v_{s,i} \int G_{s,i}(t) t\, dt. \quad (12)$$

Then, according to Eqns. (1–3):

$$G_{i,corrected} = f_i(x,y,z) G_{i,nominal}. \quad (13)$$

So the actual, measured phase shift is:

$$\Delta\phi = \gamma \sum_{i=1}^{3} v_{s,i} f_i(x, y, z) \int \Delta G_{s,i,nominal}(t) t\, dt, \quad (14)$$

and according to Eqn. (8):

$$G_{i,nominal} = \cos\theta_i \|\vec{G}_{s,nominal}\|. \quad (15)$$

For up to first order, it is true that:

$$\hat{G}_{i,corrected} = \hat{G}_{i,nominal}, \quad (16)$$

therefore, to first order, the components of $\vec{v}$ along the actual and nominal $\vec{G}_s$ directions are equivalent. Therefore:

$$v_{s,i} = \cos\theta_i \|\vec{v}_s\|. \quad (17)$$

The following general equation is then developed from assembling Eqns. (14), (15) and (17):

$$\Delta\phi = \gamma \|\vec{v}_s\| \left( \int \|\vec{G}_{s,nominal}\| t\, dt \right) \sum_i f_i(x, y, z) \cos^2\theta_i. \quad (18)$$

The first three factors in Eqn. (18) are the phase shift in the absence of gradient non-uniformity. As a result, Eqn. (18) reduces to:

$$v_{corr} = \frac{v_{measured}}{\sum_{i=1}^{3} f_i(x, y, z) \cos^2\theta_i}. \quad (19)$$

Note that from Eqn. (19):

$$v_{corr} = v_{measured} (\text{when all } f_i(x,y,z)=1). \quad (20)$$

Also Eqn. (19) reduces to Eqn. (7) if all but one of the direction cosines are zero. This is the case of orthogonal imaging.

It should be understood that the method described can naturally be extended to complex difference processing by incorporating the well known Law-of-Cosines image domain representation for that processing. Also note that the method can easily be extended to flow encoding in directions other than the slice direction (phase and readout), which in turn allows it to be used for 4 and 6-set processing.

The proposed method can also be extended to other parametric imaging, such as in diffusion imaging. In diffusion-weighted imaging, diffusion gradient lobes provide additional contrast to images according to the equation:

$$I_D = I_o e^{-b_{ij} D} \quad (21)$$

where D is the diffusion coefficient, and $b_{ij}$ is a "b-value" which is calculated from $$b_{ij} = \int K_i K_j dt \quad (22)$$

and $$K_i(t) = \gamma \int G_i(t) dt \quad (23)$$

In addition to diffusion-weighted images, such as that obtained according to Eqn. 21, an image of the diffusion coefficient itself can be displayed. This parametric image is often called the ADC map, or the apparent diffusion coefficient map.

From Eqns. 1–3, and Eqns. 21–23, we conclude that:

$$D_{corr} = \frac{D_{measured}}{f_i(x, y, z) \cdot f_j(x, y, z)} \quad (24)$$

For many applications we are interested in the case where i=j so $$D_{corr} = \frac{D_{measured}}{f_i^2(x, y, z)}. \quad (25)$$

As previously set forth, the present invention is incorporated into a system as shown in FIG. 1, in which a processor in computer 10 is programmed to perform the steps and functions as previously set forth.

The present invention has been described in terms of the preferred embodiment, and it is recognized that equivalents, alternatives, and modifications, aside from those expressly stated, are possible and within the scope of the appending claims.

What is claimed is:

1. A method of correcting systematic errors occurring due to magnetic gradient non-uniformity in phase contrast MR images for quantitative flow analysis comprising the steps of
   generating a gradient non-uniformity error map for an MR image scan that includes a representation of magnetic gradient strength non-uniformity as a function of distance;
   acquiring at least two MR data sets having flow sensitive gradients containing systematic errors due to magnetic gradient non-uniformity;
   calculating a phase difference image to determine a measured velocity image; and
   calculating a corrected velocity image using the measured velocity image and the gradient non-uniformity error map.

2. The method of claim 1 wherein the step of calculating the corrected velocity image is further defined as dividing the measured velocity image by the gradient non-uniformity error map.

3. The method of claim 1 wherein each MR data set has imaginary and real components and the MR data sets are acquired in a time domain, and further comprising the step of Fourier transforming the time domain data sets into a frequency domain.

4. The method of claim 1 wherein the direction of the flow sensitive gradients are defined by three direction angles ($\theta_1$, $\theta_2$, $\theta_3$), each measured with respect to three orthogonal axes.

5. The method of claim 4 further comprising the step of calculating a cosine of each direction angle to form a set of direction cosines (cos $\theta_1$, cos $\theta_2$, cos $\theta_3$).

6. The method of claim 4 wherein the step of calculating a corrected velocity image is calculated according to:

$$v_{corr} = \frac{v_{measured}}{\sum_{i=1}^{3} f_i(x, y, z)\cos^2\theta_i}$$

where $\theta_i$ is the direction angle associated with axis i, $f_i$ is the gradient non-uniformity error map associated with axis i, and i is one of three axes x, y, z.

7. The method of claim 1 wherein the step of generating a gradient non-uniformity error map is further defined as generating the error map as a spatial function based on pixel displacement from a gradient isocenter as measured along three axes.

8. A system for correcting systematic errors occurring due to magnetic gradient non-uniformity in phase contrast MR images for quantitative flow analysis comprising:
   means for acquiring at least two MR data sets having flow sensitive gradients containing systematic errors due to magnetic gradient iron-uniformity and generating a phase image therefrom for each acquired MR data set;
   means for generating a gradient non-uniformity error for an MR image scan, that includes a representation of magnetic gradient strength non-uniformity as a function of distance, calculating a phase difference image from each phase image generated to determine a measured velocity image, calculating a corrected velocity image using the measured velocity image and the gradient non-uniformity error map.

9. The system of claim 8 where in the means for calculating the corrected velocity image is further defined as dividing the measured velocity image by the gradient non-uniformity error map.

10. The system of claim 8 wherein the MR data sets contain imaginary and real components and are acquired in a time domain, and the means for calculating further comprising the step of Fourier transforms the time domain data sets into a frequency domain.

11. The system of claim 8 wherein each MR data set comprises three components, each component having a direction angle associated with one of three axes.

12. The system of claim 11 further comprising means for calculating a cosine of each direction angle to form a set of direction cosines (cos $\theta_1$, cos $\theta_2$, cos $\theta_3$).

13. The system of claim 11 wherein the means for calculates, a corrected velocity image according to:

$$v_{corr} = \frac{v_{measured}}{\sum_{i=1}^{3} f_i(x, y, z)\cos^2\theta_i}$$

where $\theta_i$ is the direction angle associated with axis i, $f_i$ is the gradient non-uniformity map associated with axis i, one of three axes x, y, z.

14. A system to correct systematic errors occurring due to magnetic gradient non-uniformity in phase contrast MR images for quantitative flow analysis comprising a processor programmed to:
   generate a gradient non-uniformity error map for an MR image scan that includes a representation of magnetic gradient strength non-uniformity as a function of distance;
   acquire at least two NM data sets having flow sensitive gradients containing a systematic error due to magnetic gradient non-uniformity;
   calculate a phase difference image to determine a measured velocity image; and
   calculate a corrected velocity image using the measured velocity image and the gradient non-uniformity error map.

15. The system of claim 14 wherein the processor is farther programmed to generate a gradient non-uniformity error spatial function based on pixel displacement from gradient isocenter as measured along three axes.

16. The system of claim 14 wherein each MR data set comprises three components, each component having a direction angle associated with one of three axes.

17. The system of claim 16 wherein the processor is further programmed to generate a cosine of each direction angle to form direction cosines (cos$\theta_1$, cos$\theta_2$, cos $\theta_3$).

18. The system of claim 14 wherein the processor is further programmed to generate a corrected velocity image according to:

$$v_{corr} = \frac{v_{measured}}{\sum_{i=1}^{3} f_i(x, y, z)\cos^2\theta_i}$$

where $\theta_i$ is the direction angle associated with axis i, $f_i$ is the gradient non-uniformity error map associated with axis i, and i is one of three axes x, y, z.

19. A method of correcting systematic errors occurring due to magnetic gradient non-uniformity in diffusion MR images comprising the steps of
   generating at least one gradient non-uniformity error map for an MR image scan that includes a representation of magnetic gradient strength non-uniformity as a function of distance;
   acquiring at least one MR data set with diffusion sensitizing gradients containing systematic errors due to magnetic gradient non-uniformity; calculating a measured diffusion image based on the acquired MR data set, and
   calculating a corrected diffusion image using the measured diffusion image and at least one gradient non-uniformity error map.

20. The method of claim 19 wherein the corrected diffusion image is calculated according to:

$$D_{corr} = \frac{D_{measured}}{f_i(x, y, z) \cdot f_j(x, y, z)}$$

where D is the diffusion coefficient, $f_{i,j}$ are gradient non-uniformity error maps.

21. The method of claim 20 wherein i=j and:

$$D_{corr} = \frac{D_{measured}}{f_i^2(x, y, z)}.$$

22. A system for correcting systematic errors occurring due to magnetic gradient non-uniformity in diffusion MR images comprising:
   means for acquiring at least one MR data set with diffusion sensitizing gradients that contain systematic errors due to magnetic gradient non-uniformity;
   means for generating at least one gradient non-uniformity error map for an MR image scan, that includes a representation of magnetic gradient strength non-uniformity as a function of distance, calculating a measured diffusion image based on the acquired MR data sets, and calculating a corrected diffusion image using the measured diffusion image and at least one gradient non-uniformity error map.

23. The method of claim 22 wherein the corrected diffusion image is calculated according to:

$$D_{corr} = \frac{D_{measured}}{f_i(x, y, z) \cdot f_j(x, y, z)}$$

where D is the diffusion coefficient, $f_{i,j}$ are gradient non-uniformity error maps.

24. The method of claim 23 wherein i=j and:

$$D_{corr} = \frac{D_{measured}}{f_i^2(x, y, z)}.$$

25. A system to correct systematic errors occurring due to magnetic gradient non-uniformity in diffusion MR images comprising a processor programmed to:
   generate at least one gradient non-uniformity error map for an MR image scan that includes a representation of magnetic gradient strength non-uniformity as a function of distance;
   acquire at least one MR data set with diffusion sensitizing gradients that contain systematic errors due to magnetic gradient non uniformity;
   calculate a measured diffusion image based on the at least one MR data set acquired; and
   calculate a corrected diffusion image using the measured diffusion image and the at least one gradient non-uniformity error map.

26. The method of claim 25 wherein the corrected diffusion image is calculated according to:

$$D_{corr} = \frac{D_{measured}}{f_i(x, y, z) \cdot f_j(x, y, z)}$$

where D is the diffusion coefficient, $f_{i,j}$ is the gradient non-uniformity error map.

27. The method of claim 25 wherein i=j and:

$$D_{corr} = \frac{D_{measured}}{f_i^2(x, y, z)}.$$

* * * * *